United States Patent [19]
Arasawa

[11] Patent Number: 5,175,044
[45] Date of Patent: Dec. 29, 1992

[54] SHEET-LIKE CERAMIC SUBSTRATE FOR TIP PARTS

[75] Inventor: Ryu Arasawa, Furukawa, Japan

[73] Assignee: Alps Electric Co., Ltd., Tokyo, Japan

[21] Appl. No.: 634,650

[22] Filed: Dec. 27, 1990

[30] Foreign Application Priority Data

Jan. 19, 1990 [JP] Japan .................... 2-3139[U]

[51] Int. Cl.⁵ .................. B32B 3/28; H01C 1/012
[52] U.S. Cl. .................. 428/167; 428/120; 428/192; 428/901; 156/89; 156/196; 338/306; 338/315; 338/333; 174/138 G; 174/138 J
[58] Field of Search .............. 428/156, 167, 169, 192, 428/901, 210, 81, 119, 120, 155, 409; 156/89, 19.6, 209, 901; 338/306, 312, 315, 320, 333, 203; 174/138 J, 138 G

[56] References Cited

U.S. PATENT DOCUMENTS

| | | | |
|---|---|---|---|
| 4,567,086 | 1/1986 | Fukuda et al. | 428/167 |
| 4,757,298 | 7/1988 | Nishikawa et al. | 338/308 |
| 5,041,315 | 8/1991 | Searle et al. | 428/167 |

Primary Examiner—Donald J. Loney
Attorney, Agent, or Firm—Guy W. Shoup; B. Noel Kivlin

[57] ABSTRACT

A sheet-like ceramic substrate for tip parts is provided which can effectively prevent occurrence of a crack thereof. The ceramic substrate comprises a ceramic sheet 7 having first and second primary dividing grooves 2a and 2b and first and second secondary dividing grooves 3a and 3b formed at mutually corresponding locations of the opposite faces thereof. The depth of the dividing grooves 2a, 2b, 3a and 3b is comparatively small, and while the opposite ends of the first primary dividing grooves 2a and on one face of the ceramic sheet 7 extend to a pair of opposing sides 7b of the ceramic sheet 7, the opposite ends of the second primary dividing grooves 2b on the other face of the ceramic sheet 7 are spaced from the opposing sides 7b, and the opposite ends of the first and second secondary dividing grooves 3a and 3b are spaced from the other pair of opposing sides 7a of the ceramic sheet 7.

2 Claims, 2 Drawing Sheets

SHEET-LIKE CERAMIC SUBSTRATE FOR TIP PARTS

BACKGROUND OF THE INVENTION

1. Field of the Invention

This invention relates to a sheet-like ceramic substrate from which a large number of tip resistors or the like are to be produced.

2. Description of the Prior Art

When tip resistors are to be produced, first a green sheet is prepared by forming a thin plate from slurry obtained by mixing a binder resin or the like into ceramic powder, and then a plurality of dividing grooves are formed by press work on the green sheet such that they extend perpendicularly to each other, whereafter the green sheet is baked to obtain a ceramic substrate in the form of a rectangular hard ceramic sheet which has primary dividing grooves and secondary dividing grooves engraved on a surface thereof. Here, the primary dividing grooves denote a plurality of grooves which extend in parallel to a pair of opposing sides or edges among the four sides of the rectangular ceramic sheet, and they are provided to facilitate primary dividing operation at a dividing step which will be hereinafter described. Meanwhile, the secondary dividing grooves denote a plurality of grooves which extend in parallel to the other pair of opposing ones of the four edges of the ceramic sheet and hence extend perpendicularly to the primary dividing grooves, and they are provided to facilitate secondary dividing operation at the dividing step.

Referring to FIG. 2, after a sheet-like ceramic substrate 1 is obtained in this manner, surface electrodes 4 are formed by printing on the sheet-like ceramic substrate 1 such that they extend across the dividing grooves 2, and then resistors 5 are formed by printing on the sheet-like ceramic substrate 1 such that each of them connects a pair of such surface electrodes 4 to each other, whereafter trimming is performed. Then, overcoats 6 are formed by printing such that each of the resistors 5 may be covered by one of the overcoats 6.

After then, the sheet-like ceramic substrate 1 is primarily divided along the primary dividing grooves 2 into a plurality of tablet-like elements, and then, side electrodes are formed at divisional end faces of the tablet-like elements by dipping or a like method, whereafter the tablet-like elements are secondarily divided along the secondary dividing grooves 3 and then processed by plating or the like to obtain a large number of single tip resistors.

Conventionally, such a sheet-like ceramic substrate as shown in FIG. 3 is known as such sheet-like ceramic substrate as described above.

Referring to FIG. 3, the sheet-like ceramic substrate 1 is formed from a ceramic sheet 7 having a square shape having two pairs of opposing sides or edges 7a and 7b. A plurality of primary dividing grooves 2 are formed on a face of the ceramic sheet 7 such that they extend in parallel to the opposing sides 7a while a plurality of secondary dividing grooves 3 are formed on the same face of the ceramic sheet 7 such that they extend in parallel to the opposing sides 7b and perpendicularly to the primary dividing grooves 2. While the primary dividing grooves 2 extend at the opposite ends thereof to the opposing sides 7b of the ceramic sheet 7, the secondary dividing grooves 3 are spaced at the opposite ends thereof from the opposing sides 7a of the ceramic sheet 7 so that an undesirable crack of the ceramic sheet 7 may not be caused by an external force upon printing or the like.

However, the conventional sheet-like ceramic substrate 1 described just above is disadvantageous in that, since the dividing grooves 2 and 3 of the ceramic sheet 7 must have a certain depth in order that no trouble may take place upon dividing operation of the ceramic sheet 7, a crack of the ceramic sheet 7 likely takes place along a primary dividing groove 2 when an impact is applied to the ceramic substrate 7 upon transportation or the like.

Thus, such an improved sheet-like ceramic substrate as shown in FIG. 4 has been proposed. Referring to FIG. 4, the sheet-like ceramic substrate 9 is formed from a ceramic sheet 7 which has a pair of slits 8 formed therein in addition to a plurality of primary and secondary dividing grooves 2 and 3 which are spaced from pairs of opposing sides or edges 7b and 7a, respectively. The slits 8 are formed adjacent the opposing sides 7b of the ceramic sheet 7 on the opposite sides of the secondary dividing grooves 3 and extend at the opposite ends thereof to the opposing sides 7a of the ceramic sheet 7. Then, before primary dividing operation, the ceramic sheet 7 is divided along the slits 8. The sheet-like substrate 9, however, is disadvantageous in that the number of steps of operation is increased because dividing operation of the ceramic sheet 7 along the slits 8 is performed as a preparatory step precedent to primary dividing operation, and accordingly, the workability is low.

SUMMARY OF THE INVENTION

It is an object of the present invention to provide a sheet-like ceramic substrate a possible crack of which can be prevented effectively without increasing the number of steps of operation.

In order to attain the object, according to the present invention, there is provided a sheet-like ceramic substrate, which comprises a ceramic sheet having a square shape having a pair of first opposing sides and a pair of second opposing sides, the ceramic sheet having formed on one face thereof a plurality of first primary dividing grooves which extend in parallel to the first opposing sides and have the opposite ends extending to the second opposing sides and a plurality of first secondary dividing grooves which extend in parallel to the second opposing sides and perpendicularly to the first primary dividing grooves and have the opposite ends spaced from the first opposing sides, the ceramic sheet further having formed on the other face thereof a plurality of second primary dividing grooves which extend at locations corresponding to the first primary dividing grooves and have the opposite ends spaced from the second opposing sides and a plurality of second secondary dividing grooves which extend at locations corresponding to the first secondary dividing grooves and have the opposite ends spaced from the first opposing sides.

With the sheet-like ceramic substrate, since the depth of the dividing grooves formed on the opposite faces of the ceramic sheet is comparatively small, while the opposite ends of the first primary dividing grooves on the one face of the ceramic sheet extend to the opposing sides of the ceramic sheet, the possibility that a crack may take place in the ceramic substrate is low. Consequently, a yield can be improved. Further, since the first and second primary dividing grooves as well as the first and second secondary dividing grooves can be formed at a time by press work on the ceramic sheet while it remains in the form of a green sheet before baking, no increase of steps of operation is required.

The above and other objects, features and advantages of the present invention will become apparent from the following description and the appended claims, taken in conjunction with the accompanying drawings.

DETAILED DESCRIPTION OF THE PREFERRED EMBODIMENT

Figure 1A:
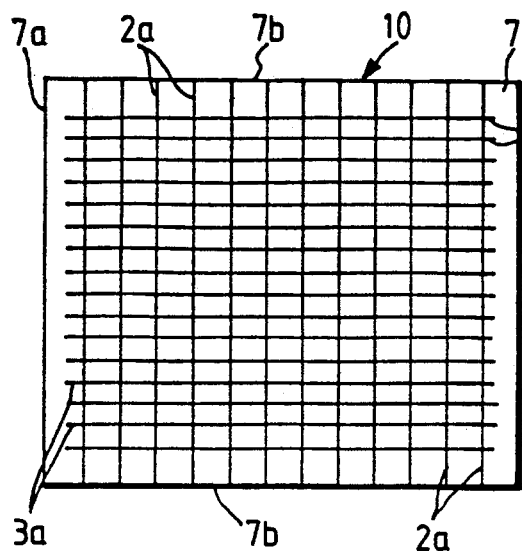
FIG. 1a is a plan view showing a face of a sheet-like ceramic substrate to which the present invention is applied.
Figure 1B:
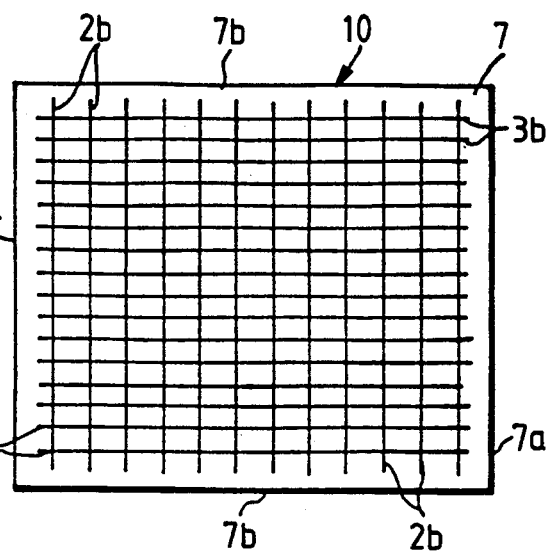
FIG. 1b is a similar view but showing the other face of the sheet-like ceramic substrate of FIG. 1.
Figure 2:
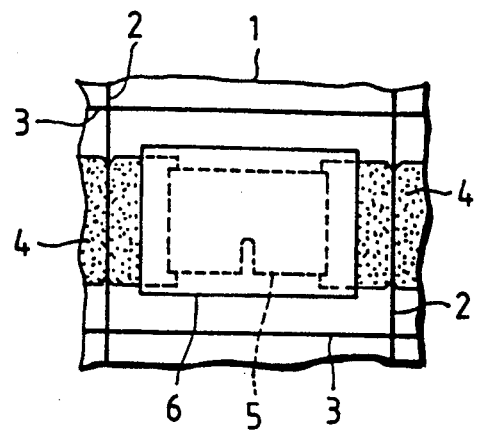
FIG. 2 is a partial plan view of a sheet-like ceramic substrate illustrating a process of producing a tip resistor.
Figure 3:
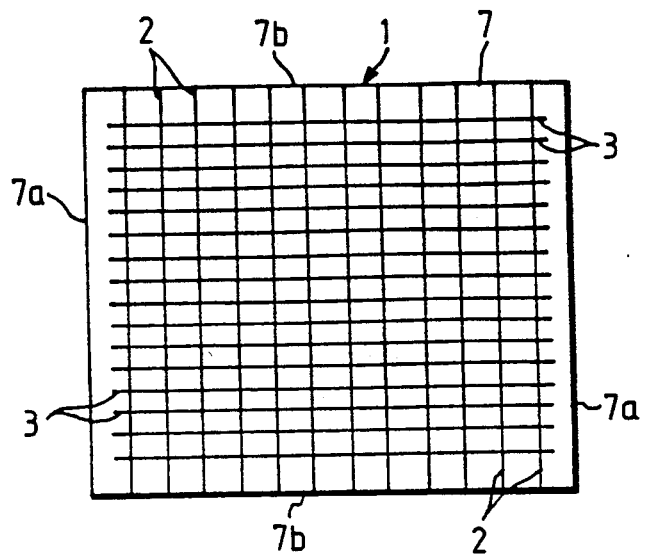
FIG. 3 is a plan view of a conventional sheet-like ceramic substrate.
Figure 4:
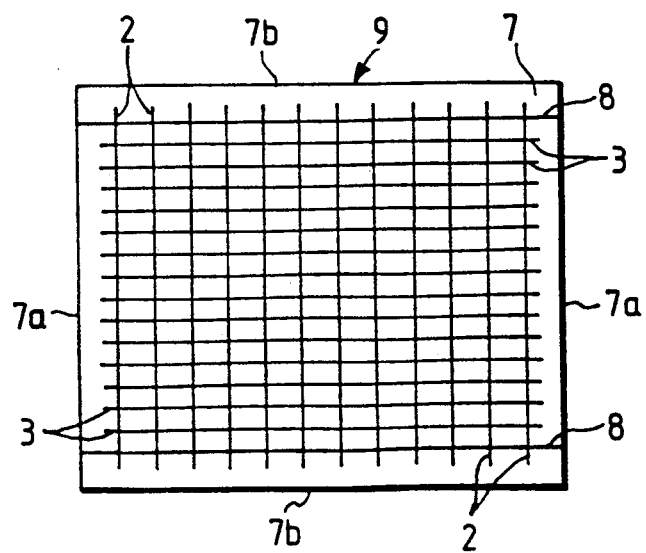
FIG. 4 is a similar view but showing another conventional sheet-like ceramic substrate.

Referring to FIGS. 1a and 1b in which like reference characters denote like elements or portions to those shown in FIGS. 3 and 4, there is shown a sheet-like ceramic substrate to which the present invention is applied.

The sheet-like ceramic substrate 10 is provided in order to obtain a large number of tip resistors therefrom and is formed from a ceramic sheet 7 having two pairs of opposing sides or edges 7a and 7b. As particularly shown in FIG. 1a, the ceramic sheet 7 has a plurality of first primary dividing grooves 2a and a plurality of first secondary dividing grooves 3a engraved on a face thereof. The first primary dividing grooves 2a extend in parallel to the opposing sides 7a of the ceramic sheet 7 and have the opposite ends extending to the opposing sides 7b of the ceramic sheet 7 while the first secondary dividing grooves 3a extend in parallel to the opposing sides 7b of the ceramic sheet 7 and perpendicularly to the first primary dividing grooves 2a and have the opposite ends spaced from the opposing sides 7a. On the other hand, as shown in FIG. 1b, the ceramic sheet 7 has a plurality of second primary dividing grooves 2b and a plurality of second secondary dividing grooves 3b engraved on the other face thereof. The second primary dividing grooves 2b are formed at locations corresponding to the first primary dividing grooves 2a and have the opposite ends spaced from the opposing sides 7b of the ceramic substrate 7 while the second secondary dividing grooves 3b are formed at locations corresponding to the first secondary dividing grooves 3a and extend perpendicularly to the second primary dividing grooves 2b but have the opposite ends spaced from the opposing sides 7a of the ceramic substrate 7. Here, the dividing grooves 2a, 2b, 3a and 3b have a depth which is smaller than the depth of dividing grooves which are conventionally formed on only one face of a ceramic sheet.

Then, surface electrodes, resistors, overcoats and so forth not shown are formed by printing on one face (front face) of the sheet-like ceramic substrate 10, and then, the sheet-like ceramic substrate 10 is primarily divided along the first and second primary dividing grooves 2a and 2b into tablet-like elements, whereafter side electrodes are formed on divisional end faces of the tablet-like elements by dipping or a like method. After then, the tablet-like elements are secondarily divided along the first and second secondary dividing grooves 3a and 3b to obtain a large number of single tip resistors.

In this manner, with the sheet-like ceramic substrate of the construction described above, since the dividing grooves are provided at mutually corresponding locations of the opposite faces of the ceramic sheet 7, the depth of the dividing grooves 2a, 2b, 3a and 3b is comparatively small, and accordingly, while the first primary dividing grooves 2a on one face of the ceramic sheet 7 extend, at the opposite ends thereof, to the opposing sides 7b of the ceramic sheet 7, since the second primary dividing grooves 2b on the other face of the ceramic sheet 7 is spaced, at the opposite ends thereof, from the opposing sides 7b of the ceramic sheet 7 and the first and second secondary dividing grooves 3a and 3b are all spaced, at the opposite ends thereof, from the opposing sides 7a of the ceramic sheet 7, the possibility that a crack may take place at the sheet-like ceramic substrate 10 is low, and a high yield can be anticipated.

Further, since the dividing grooves 2a, 2b, 3a and 3b of the sheet-like ceramic substrate described above can be formed at a time by press work using a ceramic sheet (green sheet) before baking, no increase in number of steps of operation is required.

Having now fully described the invention, it will be apparent to one of ordinary skill in the art that many changes and modifications can be made thereto without departing from the spirit and scope of the invention as set forth herein.

What is claimed is:

1. A substantially flat ceramic substrate, comprising a ceramic sheet having a substantially square shape having a pair of first opposing sides and a pair of second opposing sides, said ceramic sheet having formed on one face thereof a plurality of first primary dividing grooves which extend in parallel to said first opposing sides and have the opposite ends extending to said second opposing sides and a plurality of first secondary dividing grooves which extend in parallel to said second opposing sides and perpendicularly to said first primary dividing grooves and having the opposite ends spaced from said first opposing sides, said ceramic sheet further having formed on the other face thereof a plurality of second primary dividing grooves which extend at locations corresponding to said first primary dividing grooves and have the opposite ends spaced from said second opposing sides and a plurality of second secondary dividing grooves which extend at locations corresponding to said first secondary dividing grooves and have the opposite ends spaced from said first opposing sides.

2. A substantially flat ceramic substrate according to claim 1, wherein the dividing grooves of said ceramic substrate is formed by press work on said ceramic sheet before baking.

* * * * *